United States Patent
Lin et al.

(10) Patent No.: US 6,998,642 B2
(45) Date of Patent: Feb. 14, 2006

(54) SERIES CONNECTION OF TWO LIGHT EMITTING DIODES THROUGH SEMICONDUCTOR MANUFACTURE PROCESS

(75) Inventors: Jin-Ywan Lin, Chung Li (TW); Chung-Cheng Tu, Taipei (TW)

(73) Assignee: United Epitaxy Co., Ltd., Hsinchu (TW)

( * ) Notice: Subject to any disclaimer, the term of this patent is extended or adjusted under 35 U.S.C. 154(b) by 0 days.

(21) Appl. No.: 10/878,359

(22) Filed: Jun. 29, 2004

(65) Prior Publication Data

US 2005/0062049 A1 Mar. 24, 2005

(30) Foreign Application Priority Data

Sep. 23, 2003 (TW) ............................. 92126260 A

(51) Int. Cl.
*H01L 27/15* (2006.01)
*H01L 31/12* (2006.01)
(52) U.S. Cl. ............................ 257/79; 257/96
(58) Field of Classification Search ............... 257/79, 257/88, 94, 96–97
See application file for complete search history.

(56) References Cited

U.S. PATENT DOCUMENTS 5,945,689 A * 8/1999 Koike et al. ............... 257/88
6,878,563 B1 * 4/2005 Bader et al. ............... 438/22

* cited by examiner

*Primary Examiner*—Phat X. Cao
*Assistant Examiner*—Theresa T. Doan
(74) *Attorney, Agent, or Firm*—Troxell Law Office, PLLC

(57) ABSTRACT

A semiconductor structure with two light emitting diodes in series connection is disclosed. The semiconductor structure comprises two light emitting diodes (LEDs) having the same stack layers and abutting each other but spaced by an isolation trench. The stack layers from a bottom thereof include a thermal conductive substrate, an nonconductive protective layer, a metal adhering layer, a mirror protective layer, a p-type ohmic contact epi-layer, a upper cladding layer, an active layer, and a lower cladding layer. Two p-type ohmic contact metal electrodes for two LEDs are formed on an interface between the mirror protective layer and the ohmic contact epi-layer and buried in the mirror protective layer. The stack layers have first trenches formed therein which exposes the upper cladding layer and electrical connecting channels to connect p-type electrodes. The isolation trench is formed by patterning the exposed upper cladding layer until further exposing the nonconductive protective layer. Two n-type electrodes are formed on the lower cladding layer of two LEDs. A dielectric layer is deposited to fill the isolation trench and covered a sidewall of the first trench so that it can electrically isolate layers of the stack layers of the second LED while a metal connection trace formed thereon to connect the p-type ohmic contact electrode of the first LED and n-type of ohmic electrode of second LED.

5 Claims, 5 Drawing Sheets

SERIES CONNECTION OF TWO LIGHT EMITTING DIODES THROUGH SEMICONDUCTOR MANUFACTURE PROCESS

BACKGROUND OF THE INVENTION

1. Field of the Invention

The present invention relates to a light emitting device, and more particularly to two AlGaInP light emitting diodes in series connection by semiconductor manufacture process.

2. Description of the Prior Art

The conventional AlGaInP LED has a double heterostructure (DH), as shown in FIG. 6. The LED stacked sequentially, from a bottom thereof, has an n-type ohmic contact electrode 2, a GaAs substrate 3, an n-type $(Al_xGa_{1-x})_{0.5}In_{0.5}P$ lower cladding layer 4 with an Al composition between about 70%–100%, an $(AlGa_{1-x})_{0.5}In_{0.5}P$ active layer 5 with an Al composition of 0%–45%, a p-type $(Al_xGa_{1-x})_{0.5}In_{0.5}P$ upper cladding layer 6 with an Al composition 70%–100%, a p-type high energy band gap current spreading layer 7 such as layers of GaP, GaAsP, AlGaAs or GaInP, and a p-type ohmic contact layer 8 as well as a bonding pad 9.

With the composition alternation of the active layer 5, the wavelengths of the light emitted are varied from 650 nm: red to 555 nm: green. A drawback is generally found in the conventional LED, that is: while the light emitted from the active layer 5 towards the substrate 3 will be totally absorbed by GaAs substrate 3. It is because the GaAs substrate has an energy gap smaller than that of the active layer 5. Therefore, the light generated is absorbed resulted in lower light generated efficiency for this kind of conventional AlGaInP LED.

To overcome the substrate 3 light absorption problem, several conventional LED fabrication technologies have been disclosed. However, those conventional technologies still accompany with several disadvantages and limitations. For example, Sugawara et al. disclosed a method published in Appl. Phys. Lett. Vol. 61, 1775–1777 (1992), Sugawara et al. inserted a distributed Bragg reflector (DBR) layer in between GaAs substrate and lower cladding layer so as to reflect those light emitted toward the GaAs substrate. However, the reflectivity of DBR layer is usefully only for those light which almost vertically towards the GaAs substrate. With the decrease of injection angle, the reflectivity is drastically decreased. Consequently, the improvement of external quantum efficiency is limited.

Kish et al. disclosed a wafer-bonded transparent-substrate (TS) $(Al_xGa_{1-x})_{0.5}In_{0.5}P$/GaP light emitting diode, entitled "Very high efficiency semiconductor wafer-bonded transparent-substrate $(Al_xGa_{1-x})_{0.5}In_{0.5}P$/GaP" on Appl. Phys. Lett. Vol. 64, No. 21, 2839 (1994). The TS AlGaInP LED was fabricated by growing a very thick (about 50 $\mu$m) p-type GaP window layer by hydride vapor phase epitaxy (HVPE) formed on epi-layers light emitting structure. Subsequently, the temporary n-type GaAs substrate is selectively removed using conventional chemical etching techniques. After removing the GaAs substrate, the LED epilayer structure is then bonded to an 8–10 mil thick n-type GaP substrate.

For the light illuminated concerned, the TS AlGaInP LED exhibits a two fold improvement in light output compared to absorbing substrate (AS) AlGaInP LEDs. However, the fabrication process of TS AlGaInP LED is very complicated. Since the bonding process is to make two III–V semiconductor wafers directed bond together by heating and pressing for a period of time. Even worse, a non-ohmic contact interface between them is generally found to have high resistance. To manufacture these TS AlGaInP LEDs in high yield and low cost is difficult as a result.

Another conventional technique was proposed by Horng et al., on Appl. Phys. Lett. Vol. 75, No. 20, 3054 (1999) entitled "AlGaInP light-emitting diodes with mirror substrates fabricated by wafer bonding." Horng et al., reported a mirror-substrate (MS) of AlGaInP/metal/SiO$_2$/Si LED fabricated by wafer-fused technology. In LED, AuBe/Au stack layer function as a bonding layer for silicon substrate and epi-layer LED. However, the intensity of the AlGaInP LED is only about 90 mcd under 20 mA injecting current. The light intensity is at least lower than that of TS AlGaInP LED by 40%. It could not be satisfied.

SUMMARY OF THE INVENTION

A semiconductor structure with two light emitting diodes in series connection is disclosed. The semiconductor structure comprises two light emitting diodes (LEDs) having the same stack layers and abutting each other but spaced by an isolation trench. The stack layers from a bottom thereof include a thermal conductive substrate, an nonconductive protective layer, a metal adhering layer, a mirror protective layer, a p-type ohmic contact epi-layer, The two LEDs, respectively, have a first trench formed therein exposed the p-type ohmic contact epi-layer. An electrical conductive channel is formed in each of the first trench bottom to expose the p-type ohmic contact metal electrode. Two n-type ohmic contact metal electrodes are formed on the lower cladding layer. A bonding metal layer is then formed to connect the p-type ohmic contact metal electrodes through the electrical conductive channel and on the n-type ohmic contact metal electrodes.

To isolate two LEDs, an isolation trench to isolate therebetween is formed at a border of the first trench from the p-type ohmic contact epi-layer to the nonconductive protective layer. A dielectric layer is formed to fill in the isolation trench and extend to one sidewall of the first trench which is a boundary between the two LEDS. A conductive metal trace is then formed on the dielectric layer and extended to connect the n-type ohmic contact metal electrode of one LED to the p-type ohmic contact metal electrode of the other LED.

Alternatively, the metal adhering layer can be served as one electrode without the electrical conductive channel since it had already connected to the p-type ohmic contact metal electrode. In the situation, the bottom of the first trench is deeper than aforementioned first trench and the isolation trench is formed from the metal adhering layer to the nonconductive protective layer. The boding metal layer, the dielectric layer and the conductive trace are the same as first preferred embodiment.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a light emitting diode (LED) structure and a method of two adjacent LEDs in series connection through the semiconductor manufacture process. The detailed descriptions accompany with the FIG. 1A to FIG. 5B are as follows.

Figure 4A:
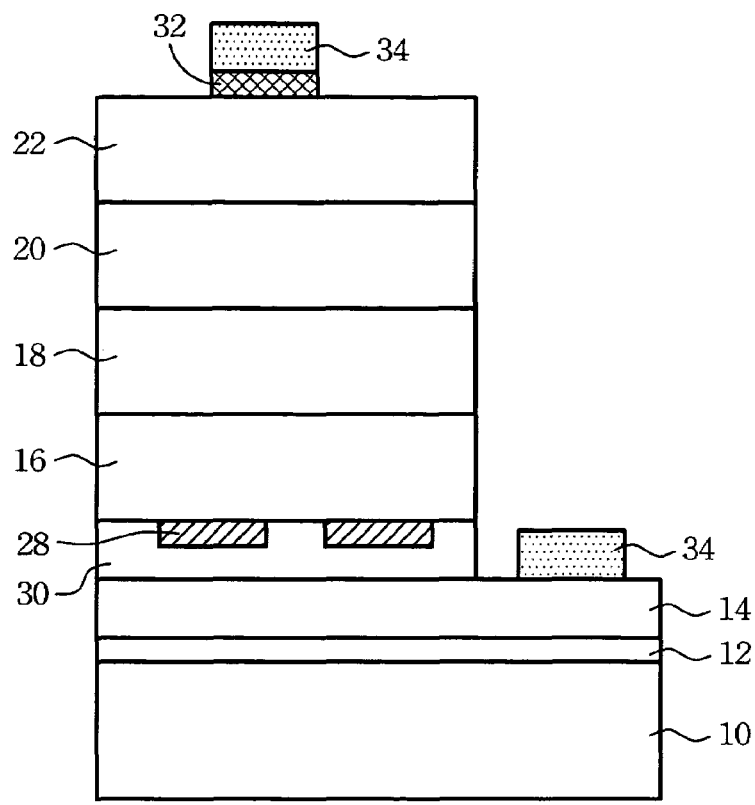
FIG. 4A and FIG. 4B are schematic cross-sectional views of a series of fabricating process for a light emitting diode having a first trench exposed the metal adhering layer and metal bonding pads formed thereafter according to the preferred embodiment of the present invention.
Figure 4B:
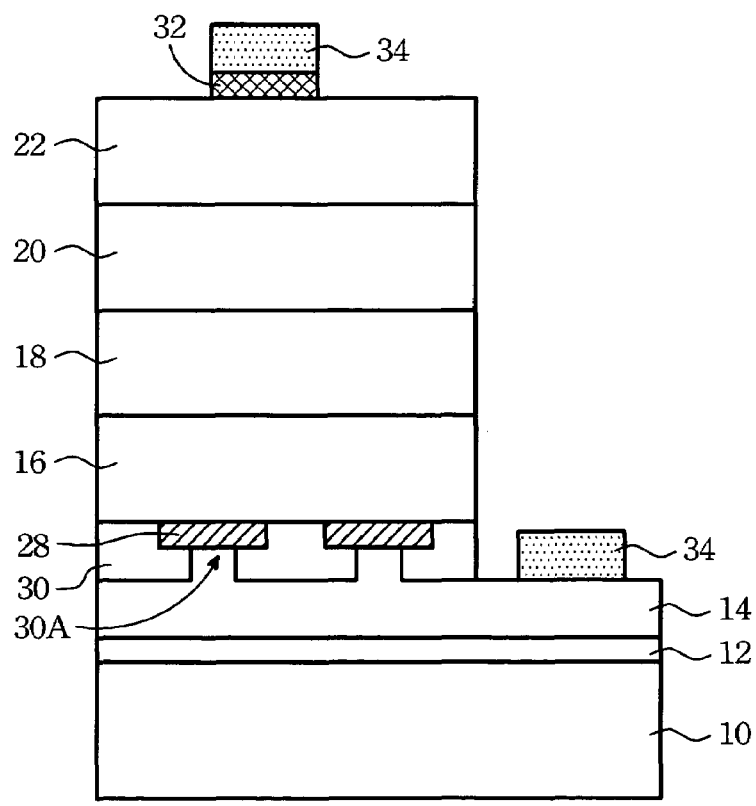
Figure 5A:
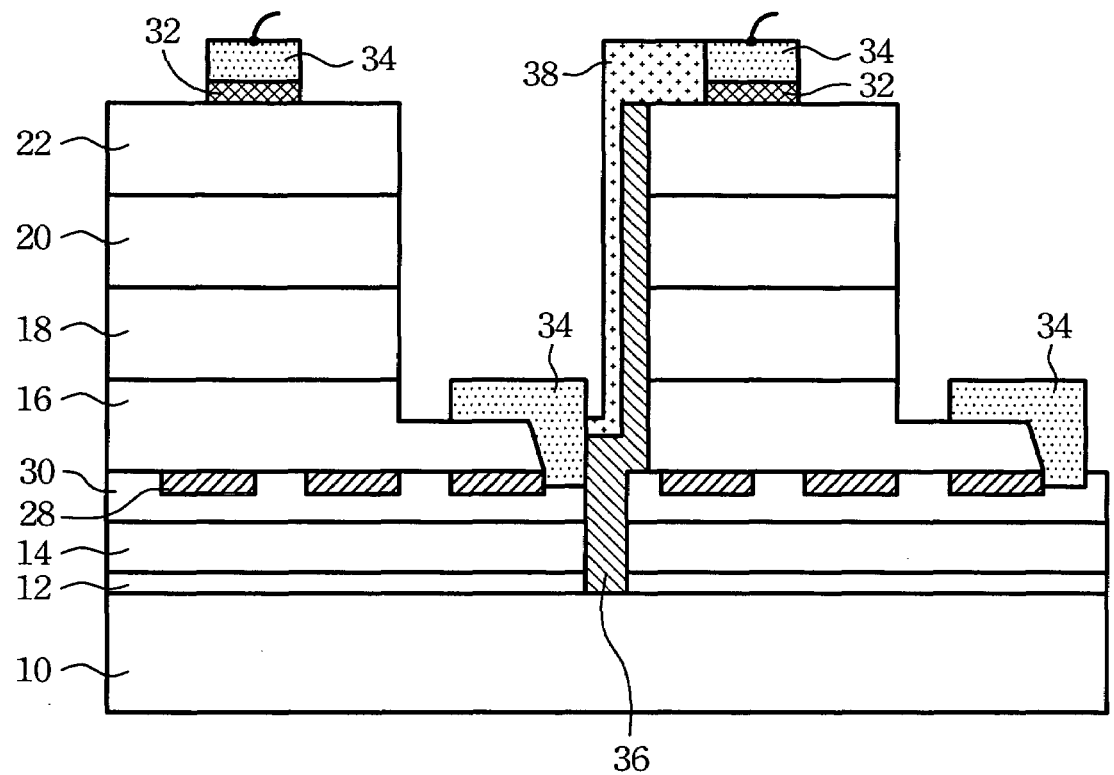
FIG. 5A shows a schematic cross-sectional view of two light emitting diodes in series connection according to the preferred embodiment of the present invention.

Since the basis structure for the two LEDs is the same before depicting the processes about how to connect them. Hence, for illustrating convenience, only one LED is shown in the FIG. 1 to 4. The main structure of two adjacent LEDs in series connection is shown in FIG. 5A.

Figure 1A:
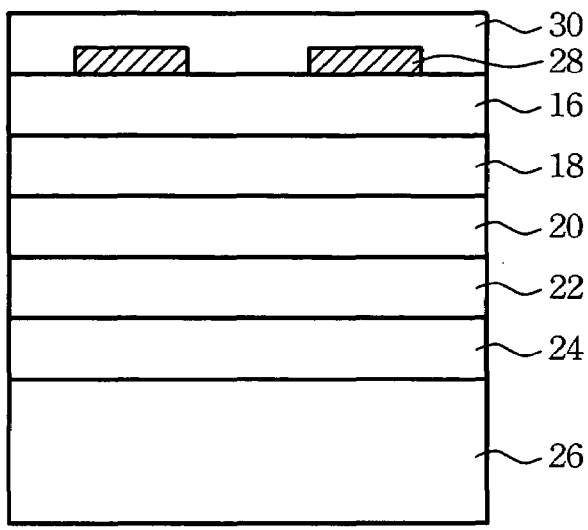
FIG. 1A is a schematic cross-sectional view of the light emitting diode having a mirror protective layer formed over the first ohmic contact electrode according to the present invention.

Referring to FIG. 1A, the cross-sectional view shows an epi-LED stack structure comprises, from a bottom thereof, an n-type temporary GaAs substrate 26 an etching stop layer 24, a lower cladding layer 22 formed of n-type $(Al_xGa_{1-x})_{0.5}In_{0.5}P$, an active layer 20 of undoped $(Al_xGa_{1-x})_{0.5}In_{0.5}P$, an upper cladding layer 18 of p-type $(Al_xGa_{1-x})_{0.5}In_{0.5}P$, an ohmic contact epi-layer 16 of p-type $(Al_xGa_{1-x})_{0.5}In_{0.5}P$. Thereafter, a p-type ohmic contact metal electrode 28 is formed on the ohmic contact epi-layer 16 by conventional processes. A mirror protective layer 30 is then deposited on the resulted surface.

The material of mirror protective layer 30 can be chosen from conductive oxide or non-conductive oxide. The conductive oxide, for example, can be a layer of $InSnO$, $In_2O_3$, $SnO_2$, $ZnO$, or $MgO$. An example of non-conductive oxide can be a layer of $Al_2O_3$, $SiO_2$, $SiNx$.

Figure 1B:
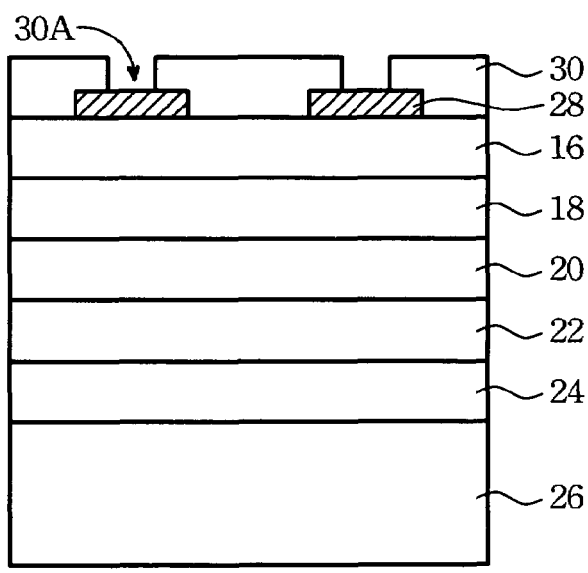
FIG. 1B is a schematic cross-sectional view of the light emitting diode with an additional channel formed in a mirror protective layer of the nonconductive type according to the present invention.

The p-electrode, apart from direct contacts the p-type ohmic contact metal electrode 28, it can also contact the metal adhering layer 14 in accordance with the present invention. In case of contacting the metal adhering layer 14, the mirror protective layer 30 formed of nonconductive oxide should include a plurality of conductive channels therein to fill with a metal adhering layer 14 thereto electrical connect the p-type ohmic contact metal electrode 28 to the metal reflector. The result is shown in FIG. 1B.

The p-type ohmic contact epi-layer 16 can be a layer selected from GaP, GaAsP, AlGaAs or GaInP, All of the candidates for serving as the p-type ohmic contact epi-layer 16 require having an energy band gap larger than that of the active layer 20 thereby alleviating the light absorption. Moreover, the p-type ohmic contact epi-layer 16 usually must have high carrier concentrations doped therein so as to form a good ohmic contact. The $(Al_xGa_{1-x})_{0.5}In_{0.5}P$ active layer 20 is with Al composition of about x=0 to 0.45. The Al dosage in the upper cladding layer 18 and lower cladding layer 22 is of about x=0.5 to 1.0. For situation of without Al containing, the wavelength of the light emitted from $Ga_{0.5}In_{0.5}P$ LED is about 635 nm, which is in range of red visible light.

As is known by skilled in the art, the ratio of forgoing compound is, for example of the preferred embodiment only, not intended to limit the claim scope. The invention is also applied to any ratio of the composition. Furthermore, the structure of active layer 18 can be a single hetero-structure (SH), a double hetero-structure (DH), or multiple quantum wells (MQW). The 0thickness of the upper cladding layer 18, active layer 20, and lower cladding layer 22 are respectively, 0.5–3.0 μm, 0.5–2.0 μm and 0.5–3.0 μm.

The preferred material of the etching stop layer 24 according to the present invention can be any III–V compound semiconductor material if it can match with that of the GaAs substrate 26 so as to reduce the dislocation density. Another constraint condition for a material to be as a candidate of the etching stop layer 24 is the etching selectively thereof. The etching stop layer 24 should be with a lower etching rate than the GaAs substrate 26.

The good candidates of those satisfied above conditions, for examples, InGaP or AlGaAs can be served. The lower cladding layer 22 can also be served as the etching stop layer 24 since it has a high selectivity to GaAs substrate 26, and thus if the thickness of the lower cladding layer 22 is thick enough, the etch stop layer 24 is optional.

Figure 2:
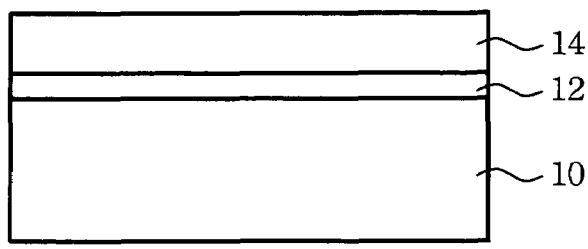
FIG. 2 is a schematic cross-sectional view of the conductive substrate formed thereover with a nonconductive protective layer and a metal adhesive layer according to the present invention.

Subsequently, a substrate structure as shown in FIG. 2 is prepared. The structure comprises a metal adhering layer 14, a nonconductive protective layer 12, and a high conductive substrate 10. Examples of metal adhering layer 14 are in, Au, Al, and Ag. The high conductive substrate 10 can be a semiconductor wafer of silicon, silicon carbide, or GaP or a metal substrate of Au, Al, Cu. The nonconductive protective layer 12 can be a layer of $Al_2O_3$, $SiO_2$, SiNx, SOG (spin on glass), silicone, BCB (B-staged bisbenzocyclobutene), epoxy, or polyimide.

Subsequently, the light emitting element as those shown in FIG. 1A or 1B is mounted to the high conductive substrate by bonding the metal adhering layer 14 with the mirror protective layer 30. The processes include heating a period of time at a temperature of about 200 to 600° C. incorporate an appropriate pressure.

Thereafter, the opaque n-type GaAs substrate 26 is then removed and stopped at the etching stop layer 24 by an etchant mixture, for example, $5H_3PO_4:3H_2O_2:3H_2O$ or $1NH_4OH:35H_2O_2$. If the material of the etching stop layer 24 is chosen from InGaP or AlGaAs, the layer 24 is preferably to be removed completely since those materials can still absorb the light.

Figure 3A:
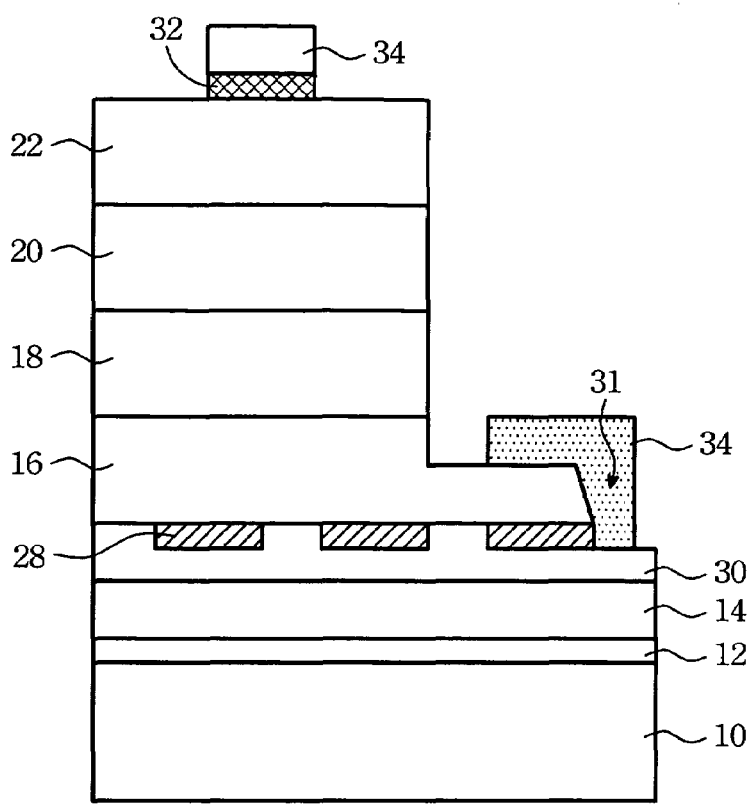
FIG. 3A and FIG. 3B are schematic cross-sectional views of a series of fabricating process for a light emitting diode having a first trench exposed the p-type ohmic contact epi-layer and an electric conductive channel formed thereafter according to the preferred embodiment of the present invention.
Figure 3B:
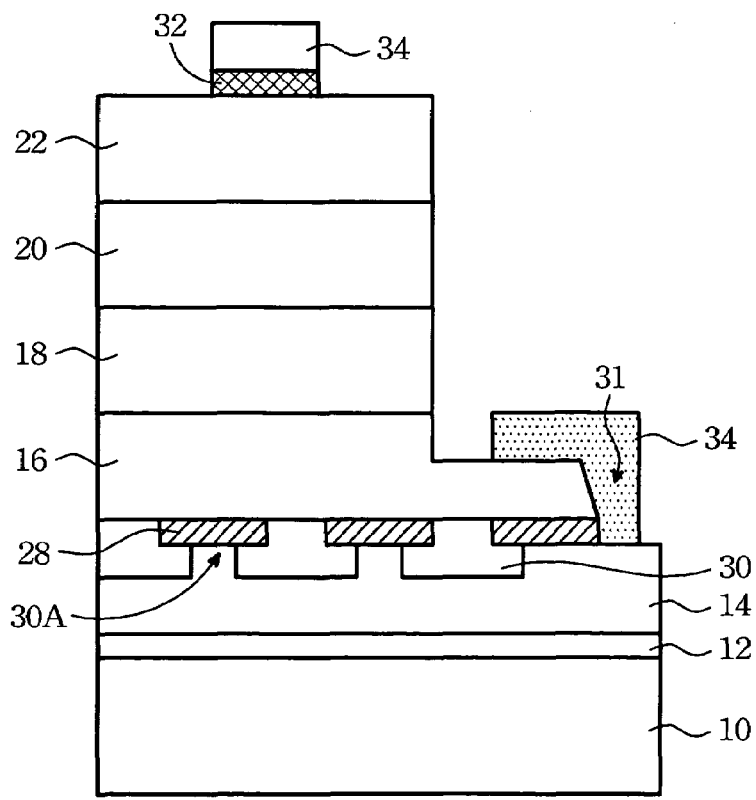

To make LED with the n electrode and the p electrode on one side, two etching steps are successively carried out. Referring to FIGS. 3A and 3B, the first step is to form a trench to expose the p-type ohmic contact epi-layer 16. The first patterning step is to remove sequentially a portion of the n-type lower cladding layer 22, the active layer 20 and the p-type upper cladding layer 18 until the p-type ohmic contact epi-layer 16 is exposed. Afterward, a second pattern step is carried out to form a slanting channel 31 to expose the p-type ohmic contact metal electrode 28.

Thereafter, a photoresist pattern (not shown) is coated on all areas. The photoresist pattern (not shown) having an opening exposed a portion of n-type lower cladding layer 22 to define position of n-type ohmic contact electrode 32. An ohmic contact metal layer 32 is then deposited on all areas including the portion on the n-type lower cladding layer 22 and on the photoresist pattern. Afterward, a liftoff process is performed to remove the ohmic contact metal layer (not shown) on the photoresist pattern. And then stripping away the photoresist pattern is done.

Still referring to FIGS. 3A and 3B, a photoresist layer (not shown) having openings over the ohmic contact electrodes 32 and the slanting channel 31 is coated on all areas. Then a bonding metal layer is then refilled the openings and deposited on the photoresist layer. A liftoff process and photoresist stripping are then successively followed. It results forming bonding pads 34, as is shown in FIG. 3A and FIG. 3B.

Figure 5B:
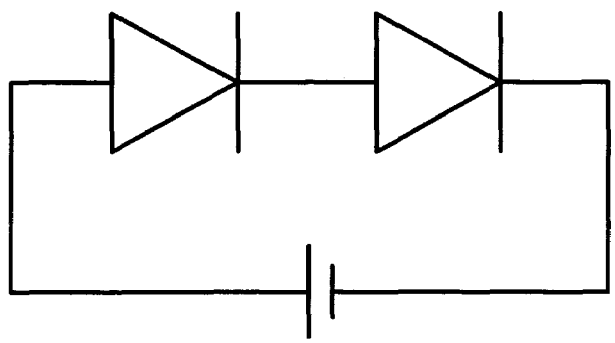
FIG. 5B shows an equivalent circuit of the structure shown in FIG. 5A.
Figure 6:
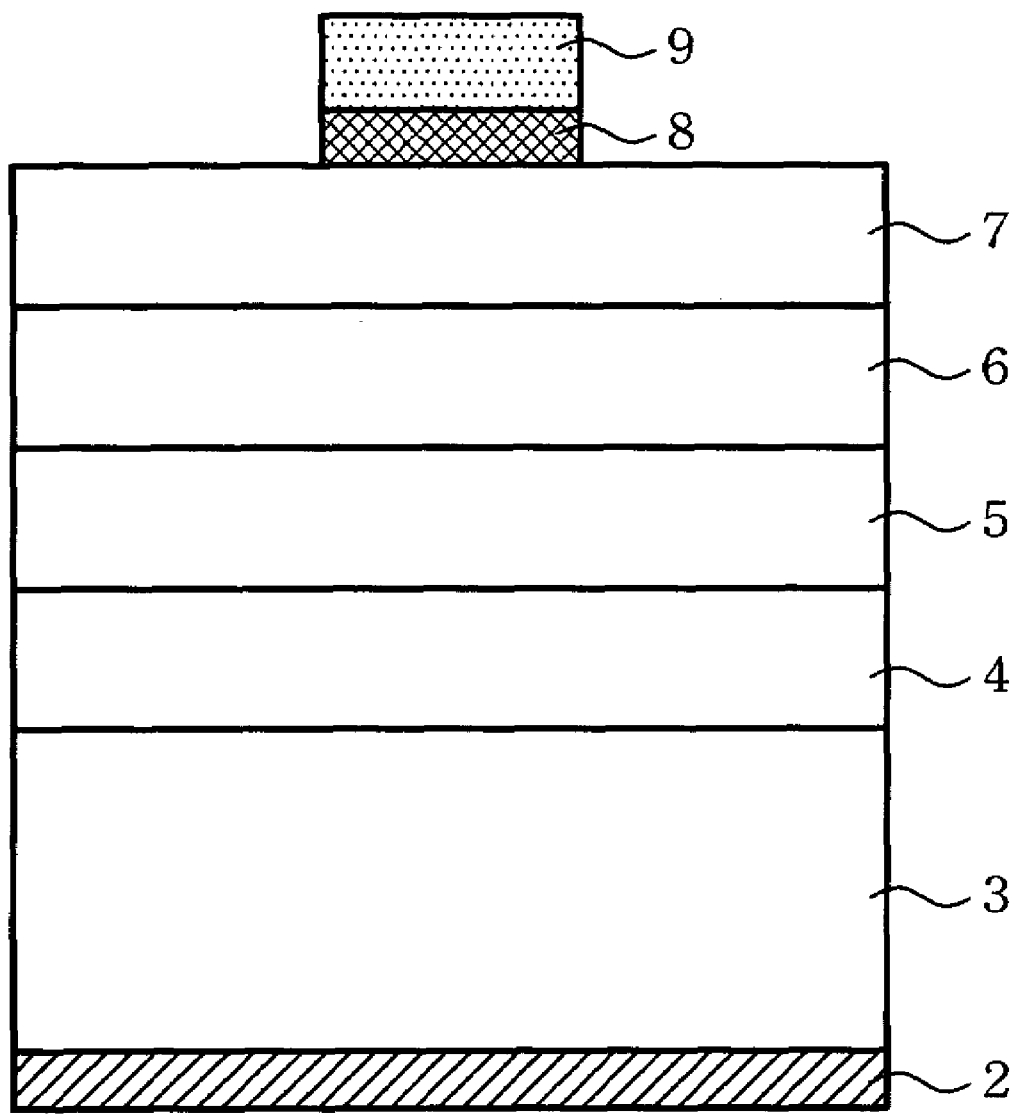
FIG. 6 is a schematic cross-sectional view of a conventional light emitting diode.

The processes of forming two adjacent LEDs in series connection are shown in FIG. 5A. In FIG. 5A, an etching step is further performed to form an isolation trench by chemical etch, or ionic etch the p-type ohmic contact epi-layer 16, mirror protective layer 30, metal adhering layer 14, and the nonconductive protective layer 12 abutting the bonding metal layer 34 at the mesa. The isolation trench is to separate the LED substrate into two LED chips with the same structure and having the high conductive substrate 10 in common. An isolation layer formed of $Al_2O_3$, $SiO_2$, SiNx, SOG (spin on glass), silicone, BCB (B-staged bisbenzocyclobutene), epoxy, or polyimide by conventional lithographic deposition, and liftoff is then formed on the sidewall of the LED chip and refills the isolation trench where the sidewall is abutting the isolation trench. A conductive trace 38 is then formed on the isolation layer adjoining the p-type ohmic contact metal electrode of the first chip and the n-type ohmic contact metal electrode of the other chip to implement the two chips series connection. The result is shown in FIG. 5A. FIG. 5b shows a schematic circuit diagram.

Since the aforementioned LED in first preferred embodiment includes metal adhering layer 14, which electrically connects to the p-type ohmic contact metal electrode 28, hence, the trench bottom can be formed alternatively at the metal adhering layer 14 instead of the p-type ohmic contact epi-layer 16. The second etch step of forming slating trench is thus can be skipped. The results are shown in FIG. 4A for conductive type mirror protective layer 30 and FIG. 4B for non-conductive mirror protective layer 30. The processes of forming metal bonding pads 34 and conductive trace 38 to connect two LED in series are the same as first preferred embodiment.

While the preferred embodiment of the invention has been illustrated and described, it will be appreciated that various changes can be made therein without departing from the spirit and scope of the invention.

What is claimed is:

1. A semiconductor structure of series connection of two light emitting diodes, comprising:
   a first light emitting diode having stack layers from a bottom thereof including a thermal conductive substrate, an nonconductive protective layer, a metal adhering layer, a mirror protective layer, an ohmic contact epi-layer, a upper cladding layer, an active layer, and a lower cladding layer, further, a first ohmic contact metal electrode formed on an interface between said mirror protective layer and said ohmic contact epi-layer and buried in said mirror protective layer, a second ohmic contact metal electrode formed on said lower cladding layer;
   a second light emitting diode having the same stack layers as said first light emitting diode;
   still wherein both of said light emitting diodes, respectively, have a first trench formed therein which has a bottom exposed said ohmic contact epi-layer and said trench bottom contains an electrical conductive channel connecting said first ohmic contact metal electrode;
   an isolation trench formed at a border of said first trench and with a bottom exposed said nonconductive protective layer to isolate said first light emitting diode and said second light emitting diode;
   a dielectric layer formed to fill in said isolation trench and extend to a sidewall of said first trench, said sidewall being a boundary between said first and said second light emitting diode; and
   a metal bonding layer formed on said dielectric layer and extended to connect said second ohmic contact metal electrode of said first light emitting diode and said second ohmic contact metal electrode of said second light emitting diode.

2. The semiconductor structure according to claim 1, wherein said mirror protective layer is selected one from the group consisting of ITO, In2O3, SnO, ZnO, MgO, $Al_2O_3$, $SiO_2$, SiNx, SOG (spin on glass), silicone, BCB (B-staged bisbenzocyclobutene), epoxy, polyimide, and the combination thereof.

3. The semiconductor structure according to claim 2, further comprising channels in said mirror protective layer to provide a connection between said metal adhering layer and said first ohmic contact metal electrode while said mirror protective layer is a non-conductive type.

4. The semiconductor structure according to claim 1, wherein said thermal conductive substrate is selected from the group consisting of Al, Au, Cu, Si, and SiC.

5. The semiconductor structure according to claim 1, wherein said metal adhering layer is selected one from the group consisting of In, Au, Ag, and Al and said bonding metal layer is selected one from the group consisting of Au and Al.

* * * * *